US007902452B2

(12) United States Patent
Arhart et al.

(10) Patent No.: US 7,902,452 B2
(45) Date of Patent: Mar. 8, 2011

(54) MULTILAYER IONOMER FILMS FOR USE AS ENCAPSULANT LAYERS FOR PHOTOVOLTAIC CELL MODULES

(75) Inventors: Richard J. Arhart, Wilmington, DE (US); Diego Boeri, Geneva (CH); Geraldine M. Lenges, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 940 days.

(21) Appl. No.: 10/870,454

(22) Filed: Jun. 17, 2004

(65) Prior Publication Data

US 2005/0279401 A1    Dec. 22, 2005

(51) Int. Cl.
*H01L 31/048* (2006.01)
(52) U.S. Cl. .................. 136/251; 136/259; 428/519
(58) Field of Classification Search .............. 428/36, 428/35, 519, 518, 520, 910; 437/2, 211, 437/212, 219; 156/99, 106, 196, 214, 285, 156/286, 297, 298, 307; 136/243–265
See application file for complete search history.

(56) References Cited

U.S. PATENT DOCUMENTS

| | | | | |
|---|---|---|---|---|
| 3,957,537 | A | | 5/1976 | Baskett et al. |
| 4,082,877 | A | * | 4/1978 | Shadle ................... 428/220 |
| 4,352,850 | A | * | 10/1982 | Yamamoto et al. .......... 428/214 |
| 4,640,856 | A | * | 2/1987 | Ferguson et al. ........... 428/34.9 |
| 4,671,987 | A | * | 6/1987 | Knott et al. ................ 428/216 |
| 4,865,902 | A | * | 9/1989 | Golike et al. ............... 428/215 |
| 4,976,898 | A | * | 12/1990 | Lustig et al. ................ 264/471 |
| 5,476,553 | A | | 12/1995 | Hanoka et al. |
| 5,478,402 | A | | 12/1995 | Hanoka |
| 5,508,205 | A | * | 4/1996 | Dominguez et al. ........... 438/67 |
| 5,712,044 | A | | 1/1998 | Fanselow |
| 5,733,382 | A | | 3/1998 | Hanoka |
| 5,741,370 | A | | 4/1998 | Hanoka |
| 5,762,720 | A | | 6/1998 | Hanoka et al. |
| 5,986,203 | A | | 11/1999 | Hanoka et al. |
| 6,086,967 | A | * | 7/2000 | Whiteman et al. ........... 428/35.7 |
| 6,114,046 | A | | 9/2000 | Hanoka |
| 6,187,448 | B1 | | 2/2001 | Hanoka et al. |
| 6,319,596 | B1 | | 11/2001 | Kernander et al. |
| 6,320,115 | B1 | | 11/2001 | Kataoka et al. |
| 6,353,042 | B1 | | 3/2002 | Hanoka et al. |
| 6,414,236 | B1 | | 7/2002 | Kataoka et al. |
| 6,581,359 | B1 | | 6/2003 | van den Broek |
| 6,586,271 | B2 | | 7/2003 | Hanoka |
| 6,660,930 | B1 | | 12/2003 | Gonsiorawski |
| 6,743,847 | B1 | | 6/2004 | Sullivan et al. |
| 2002/0038664 | A1 | * | 4/2002 | Zenko et al. ................ 136/251 |
| 2003/0000568 | A1 | | 1/2003 | Gonsiorawski |
| 2003/0021930 | A1 | * | 1/2003 | Mientus et al. ............. 428/40.1 |
| 2003/0198715 | A1 | * | 10/2003 | Morris et al. .............. 426/106 |
| 2004/0050479 | A1 | * | 3/2004 | McEwen et al. ............. 156/166 |
| 2004/0103989 | A1 | * | 6/2004 | Lin ........................ 156/309.6 |
| 2004/0144415 | A1 | | 7/2004 | Arhart |
| 2005/0136263 | A1 | * | 6/2005 | Roberts et al. ............. 428/423.1 |
| 2009/0023867 | A1 | | 1/2009 | Nishijima et al. |
| 2009/0120489 | A1 | | 5/2009 | Nishijima et al. |

FOREIGN PATENT DOCUMENTS

| | | |
|---|---|---|
| EP | 1092532 A1 | 4/2001 |
| JP | 06-322334 A | 11/1994 |
| JP | 08-316508 A | 11/1996 |
| JP | 11-020089 | 1/1999 |
| JP | 11-026791 A | 1/1999 |
| JP | 2000-186114 A | 7/2000 |
| JP | 2001-089616 A | 4/2001 |
| JP | 2001-119047 A | 4/2001 |
| JP | 2001-119056 A | 4/2001 |
| JP | 2001-119057 A | 4/2001 |
| JP | 2001144313 A | 5/2001 |
| JP | 2004-031445 A | 1/2004 |
| JP | 2005-034913 | 2/2005 |
| JP | 2005-064266 | 3/2005 |
| JP | 2005-064268 | 3/2005 |
| JP | 2006-032308 A | 2/2006 |
| JP | 2006-036874 A | 2/2006 |
| JP | 2006-036875 A | 2/2006 |
| JP | 2006-036876 A | 2/2006 |
| JP | 2006-186237 A | 7/2006 |
| JP | 2006-190865 A | 7/2006 |
| JP | 2006-190867 A | 7/2006 |
| WO | 2006/085603 A1 | 8/2006 |
| WO | 2006/095762 A1 | 9/2006 |

OTHER PUBLICATIONS

Overview of materials for Linear Low Density Polyethylene (LLDPE), Film Grade. Datasheet [online]. MatWeb [retrieved on Nov. 5, 2007]. Retrieved from the internet: <URL: http://www.matweb.com/search/DataSheet.aspx?MatID=78258>.*
Overview of materials for Very Low Density Polyethylene (VLDPE). Datasheet [online]. MatWeb [retrieved on Nov. 5, 2007]. Retrieved from the internet: <URL: http://www.matweb.com/search/DataSheet.aspx?MatID=78252>.*
Overview of materials for Ethylene Vinyl Acetate Copolymer (EVA), Film Grade. Datasheet [online]. MatWeb [retrieved on Nov. 5, 2007]. Retrieved from the internet: <URL: http://www.matweb.com/search/DataSheet.aspx?MatID=78294>.*
Dow FLEXOMER™ ETS-9066 NT 7, 0.8 mil Very Low Density Polyethylene (VLDPE) Resin. Datasheet [online]. MatWeb [retrieved on Nov. 5, 2007]. Retrieved from the internet: <URL: http://www.matweb.com/search/DataSheet.aspx?MatID=30598>.*

(Continued)

*Primary Examiner* — Nam X Nguyen
*Assistant Examiner* — Bach T Dinh
(74) *Attorney, Agent, or Firm* — Kevin S. Dobson; Mark D. Kuller

(57) ABSTRACT

The present invention is photovoltaic (solar) cell module comprising a multilayer laminate ionomer film as an encapsulant layer wherein the laminate has a light transmission of at least 85%, and or a haze of less than 6%, and wherein the laminate has a modulus of less than 15,000 psi.

33 Claims, No Drawings

OTHER PUBLICATIONS

DuPont Surlyn 1705-1 Zinc Ionomer Resin for Blown and Cast Film [Retrieved on Jul. 18, 2008]. Retrieved from the Internet <URL: http://www.matweb.com/search/DataSheet. aspx?MatGUID=76f77125520d4071b323593ccb59bceb &ckck=1>.*

Matweb Material Property Data for Surlyn 1601 [Retrieved on Jan. 2, 2009]. Retrieved from the internet <URL:http://www.matweb.com/search/DataSheet. aspx?MatGUID=05ab70e3d1ca488eae578546c238588e&ckck=1>.*

Matweb Material Property Data for Surlyn 1901 [retrieved on May 8, 2009]. Retrieved from the internet <URL:http://www.matweb.com/search/DataSheet. aspx?MatGUID=7ff9e13adf0645ecabbe9bcc84972036&ckck=1>.*

Matweb Material Property Data for Surlyn 1802 [retrieved on May 8, 2009]. Retrieved from the internet <URL:http://www.matweb.com/search/DataSheet. aspx?MatGUID=de38e98596944c4091315a096eb1ac1e>.*

PCT International Search Report, International Application No. PCT/US2005/021243, dated Jun. 15, 2005.

PCT International Preliminary Report on Patentability for International Application No. PCT/US2005/021243 dated Jan. 4, 2007.

ASTM D1003-00.

ASTM D882.01.

English Abstract and Machine Translation of JP 11-020089 from JPO/INPIT Website.

* cited by examiner

MULTILAYER IONOMER FILMS FOR USE AS ENCAPSULANT LAYERS FOR PHOTOVOLTAIC CELL MODULES

BACKGROUND OF THE INVENTION

1. Field of the Invention

This invention relates to films useful as encapsulants for photovoltaic (solar) cell modules. This invention particularly relates to films comprising ethylene acid copolymer ionomers useful as encapsulants for photovoltaic cell modules.

2. Description of the Related Art

Photovoltaic (solar) cell modules are units that convert light energy into electrical energy that can be useful for powering machinery, electrical equipment and appliances, for example. Typical or conventional construction of a solar cell module consists of 5 (five) structural layers. The layers of a conventional solar cell module are constructed in the following order starting from the top, or incident layer (that is, the layer first contacted by incident light) and continuing to the backing (the layer furthest removed from the incident layer): (1) incident layer/(2) encapsulant layer/(3) voltage-generating layer/(4) second encapsulant layer/(5) backing.

The function of the incident layer is to provide a transparent protective window that will allow sunlight into the cell module. The incident layer is typically a glass plate, but could conceivably be any material which is transparent to sunlight.

The encapsulating (encapsulant) layer is designed to encapsulate and protect the fragile voltage generating layer. Typically the encapsulant layer comprises two polymeric layers sandwiched around the voltage generating layer. The two encapsulant layers can be the same material or different and distinct materials. For expediency, unless specifically noted, when the encapsulant layers are mentioned hereinafter the singular form will be used and be taken to mean either one encapsulant layer or multiple encapsulant layers. However, the optical properties of at least the first encapsulant layer must be such that light can be effectively transmitted to the voltage-generating layer.

A conventional encapsulant layer typically comprises ethylene/vinyl acetate copolymer (EVA). Some encapsulant layers are obtained from a copolymer obtained by copolymerization of monomers of ethylene with monomers of ethylenically unsaturated carboxylic acids, wherein the copolymer is subsequently fully or partially neutralized to the acid salt. Neutralized ethylene/acid copolymers of this type are conventionally known as ionomers. Ionomers are commercially available from E.I. DuPont de Nemours and Company (DuPont). Still other materials can be used as an encapsulant layer.

The voltage-generating layer is typically a silicon wafer that converts photons of sunlight into electrical energy.

A solar cell backing functions to protect the solar cell module from the deterious effects of the environment. The requirements for a solar cell backing are: (1) good weatherability (that is, resistance to the effects of weather); (2) high dielectric strength; (3) low moisture vapor transmission rate (MVTR); and (4) mechanical strength. The backing layer must also have good adhesion to the second encapsulant layer, to prevent delamination of the cell materials.

In a solar cell module, high modulus in an encapsulant layer can be undesirable because stresses can be generated in the photovoltaic module which result in spalling, failure at the interface of the glass-top layer, or adhesive failure of the module. It has been found that in a solar cell module wherein the top layer is glass and the backing is a polymeric material and wherein the encapsulant layer is an ionomeric material, the modulus of the ionomer layer can be too high. High modulus in a commercially available material can sometimes be overlooked because the ionomer offers optical properties that are desirable for the application. Unfortunately, substitution for some materials having acceptable optical properties but less than acceptable modulus with commercially available ionomers having acceptably low modulus can be a poor alternative because the optical properties can be less than desirable.

Good optical properties are important in a solar cell module because it is a requirement of good performance that light incident to the cell be transmitted efficiently and effectively to the voltage-generated layer. Poor light transmission reduces the efficiency and/or productivity of the photovoltaic generation process.

Blending ionomers having acceptable modulus with other ionomers having acceptable optical properties can result in optical properties and modulus that are intermediate between the properties of the components. This can be an unsatisfactory result where improved optical properties or modulus are desirable.

It can be desirable, in the manufacture of solar cell modules, to provide an ionomer encapsulant layer that incorporates both the physical and optical properties desirable in a solar cell module.

SUMMARY OF THE INVENTION

In one aspect, the present invention is an optically transparent multilayer laminate film comprising: at least three layers of ionomeric film, wherein (a) at least two of the at least three layers are chemically distinct from each other, (b) the laminate has a modulus of less than about 15,000 psi as measured according to ASTM D882-01 and (c) the laminate (i) transmits at least about 85% of incident visible light and/or (ii) has a haze value of equal to or less than about 6% as measured according to ASTM D1003-00.

In another aspect, the present invention is a photovoltaic (solar) cell module that includes an encapsulant layer comprising an optically transparent multilayer laminate film comprising: at least three layers of ionomeric film, wherein (a) at least two of the at least three layers are chemically distinct from each other, (b) the laminate has a modulus of less than about 15,000 psi as measured according to ASTM D882-01 and (c) the laminate (i) transmits at least about 85% of incident visible light and/or (ii) has a haze value of equal to or less than about 6% as measured according to ASTM D1003-00.

In another aspect, the present invention is a process for preparing an optically transparent multilayer laminate encapsulant layer having a modulus of less than about 15,000 psi as measured according to ASTM D882-01 and wherein the laminate (i) transmits at least about 85% of incident visible light and/or (ii) has a haze value of equal to or less than about 6% as measured according to ASTM D1003-00, the process comprising the step of laminating at least three layers of ionomer film together, wherein at least one of the layers has a transmittance of less than 85% and/or a haze value of greater than about 6% when measured independent of the other layers and measured prior to lamination.

In still another aspect, the present invention is a process for preparing an optically transparent multilayer laminate useful as an encapsulant layer in a solar cell module, wherein the multilayer laminate has a modulus of less than about 15,000 psi as measured according to ASTM D882-01 and wherein the laminate (i) transmits at least about 85% of incident visible light and/or (ii) has a haze value of equal to or less than about 6% as measured according to ASTM D1003-00, the process comprising the step of coextruding at least three layers of ionomer film, wherein at least one of the co-extruded layers has a transmittance of less than 85% and/or a haze value of greater than about 6% when measured independent of the other layers and measured prior to lamination.

DETAILED DESCRIPTION OF THE INVENTION

In one embodiment the present invention is an optically transparent multilayer laminate film comprising at least three layers of ionomeric film. By optically transparent it is meant that optical measurements taken on the combination of the at least three ionmeric layers of the present invention are at least 85% transparent to light in the visible region of the light spectrum. Optical transparency can be related to the haze of the multilayer laminate film. In the practice of the present invention, the haze of the encapsulant layer laminate structure is not greater than 6%. An encapsulant layer having greater than 6% haze or less than 85% transmittance may not be an efficient cell for producing electric energy.

For the purposes of the present invention, the outermost layers of the laminate encapsulant shall be termed the "optical layers", and the at least one layer positioned between the optical layers shall be termed a "structural layer". A multilayer transparent laminate of the present invention is constructed such that the optical layers form an interface with opposite surfaces of the at least one structural layer. The structural layer can comprise more than one structural layer that so long as it is "optically homogenous", that is to say that the structural layer does not become less transparent due to the incorporation of the multiple structural layer. Put another way, a multiple layer structural layer is optically homogeneous for the purposes of the present invention if the transmission of light through one structural layer is essentially unchanged (within experimental error) from that of the multilayer structural layer.

While the encapsulant laminate structure of the present invention transmits at least about 85% of the incident light, and/or has a haze of less than about 6%, each of the individual components of the laminate do not necessarily have optical properties that meet these standards. In particular, the at least one structural layer of the present invention is not required to have optical properties which meet the minimum standards of the laminate. In fact, it is one object of the present invention to overcome the relatively poor optical properties of the structural component by preparing a laminate with acceptable optical properties.

In the practice of the present invention, the multilayer encapsulant comprises at least three ionomeric layers laminated together to form a multilayer laminate. The multilayer laminate comprises: (1) at least two ionomeric optical layers having transparency of at least about 85% and/or a haze value of less than about 6%, and (2) at least one ionomeric structural layer having a modulus of less than about 15,000 psi and a transparency of greater than about 85% and/or a haze of greater than about 6%.

The optical layers each independently transmit at least about 85% of light incident to their respective surfaces. Preferably optical layers transmit at least about 88% of incident light, and more preferably at least about 89% of the incident light. Most preferably the optical layers transmit at least about 90% of incident light. In a much preferred embodiment the optical layers can each independently transmit at least about 91%, 92%, 93%, 94%, 95% of incident light. The haze of the optical layers is preferably less than about 5%, more preferably less than about 4%, and most preferably less than about 3%. The optical layers can have a modulus of greater than 15,000 psi without detrimentally affecting the modulus of the product laminate.

In the practice of the present invention the optical layers of the multilayer encapsulant are chemically distinct from the at least one structural layer. For example, the percentage of the acid component in the ionomer can vary between at least two of the ionomer layers, as can the level of neutralization of the acid components, as can the identity of the counterion present in the at least two ionomers, as can the presence or absence of a third comonomer. Each of these conditions, and others, can be varied independently or in combination to make the optical layers chemically distinct from the structural layer of the encapsulant.

In the practice of the present invention, the optical layers of the encapsulant can be either identical to or distinct from the other encapsulant layers. The optical layers are selected such that: (1) they provide suitable adhesion where they interface with the other layers of the laminate; (2) they provide optical properties to the multilayer laminate encapsulant that are as described herein and thereby make the encapsulant suitable for use in the practice of the present invention; and (3) the modulus of the multilayer laminate encapsulant is not increased to a level above 15,000. Preferably the optical layers have a modulus of less than about 15,000. More preferably, or alternatively, the optical layers of the laminate structure are identical.

The encapsulant layer of the solar cell module comprises at least one structural layer comprising an ionomer of the type having a Secant modulus of less than about 15,000 psi. Preferably the modulus of the at least one layer is less than 14,000, and most preferably the modulus is less than about 13,000.

In another embodiment, a laminate film of the present invention is a multilayer ionomeric laminate film wherein the structural layer having low modulus is a composite film that comprises two or more layers of polymer film wherein the modulus of the composite structural layer is less than about 15,000. Preferably the modulus of the composite structural layer is less than 14,000, and most preferably the modulus is less than about 13,000.

A composite structural layer is suitable for use herein if the optical properties of the multilayer encapsulant comprising the composite structural layer meet the optical requirements of an encapsulant of the present invention.

The composite structural layer can comprise, in addition to an ionomer, any polymer that imparts the desirable modulus and required optics to the laminate encapsulant. For example, the structural layer can be an ionomer, polyurethane, ethylene vinyl acetate (EVA), polyvinyl chloride (PVC), polyester, polyacetals, ethylene acid copolymers (which can be inclusive of ethylene acid terpolymers or higher copolymers), ethylene acrylate copolymers (which can be inclusive of terpolymers and higher copolymers), or other polymeric layers that (1) have suitable physical properties; (2) are or can be made to be at least 85% transparent; and (3) can be laminated to an ionomer to yield a laminate with good adhesion. Good adhesion for the purposes of the present invention is adhesion that is sufficient to prevent delamination of the solar cell module, and can be determined according to conventional methods. Quantitatively, the adhesion required in a solar cell module is known to one of ordinary skill in the art of manufacturing solar cell modules.

In still another embodiment, a structural layer of the present invention can comprise a non-ionomeric polymer with the proviso that it has the properties described herein for an ionomeric polymer layer, including suitable adhesion to the optical layers to prevent delamination of the multilayer encapsulant. Suitable polymers include EVA polymers such as are used conventionally in solar cell module encapsulant layers.

A multilayer encapsulant of the present invention surprisingly takes on the optical properties of the optical layers, and the modulus of the structural layer(s) to provide an encapsulant having both desirable optical properties and desirable modulus for use in a solar cell module. This result is surprising because the optical layers can provide desirable optical properties even in spite of the poor optical properties of the structural layer(s).

Ionomers useful in the practice of the present invention are copolymers obtained by the copolymerization of ethylene and an ethylenically unsaturated $C_3$-$C_8$ carboxylic acid. Preferably the unsaturated carboxylic acid is either acrylic acid or methacrylic acid. The acid copolymer preferably includes from about 8 wt % to about 20 wt % of the acid, based on the total weight of the copolymer. Ionomers useful as optical layers in the practice of the present invention preferably comprise from about 12 wt % to about 20 wt % acid, more preferably from about 14 wt % to about 19 wt % acid, and most preferably from about 15 wt % to about 19 wt % acid. Less than about 12 wt % acid can result in too low transmittance or too high haze of the optical layers.

In a particularly preferred embodiment, structural layers useful in the practice of the present invention are preferably copolymers ionomers, and more preferably terpolymers ionomers that comprise from about 8 wt % to about 12 wt % acid. It is to be understood that in the present invention the acid component described is inclusive of any neutralized acid in the salt form. If the acid is methacrylic acid, the acid copolymer preferably includes from about 15 wt % to about 25 wt % methacrylic acid. The acid groups in the copolymer can be highly neutralized to include up to about 100 wt % of the carboxylic acid. Preferably, from about 10 to about 90 wt % of the acid groups are neutralized. Conventional ionomers of this type can be obtained commercially from E.I. DuPont de Nemours and Company (DuPont), for example.

Conventional ionomers can include, in addition to the ethylene and acid components, a third comonomer component which is an ester of an ethylenically unsaturated carboxylic acid. Conventional ionomers that include a third comonomer are commercially available from DuPont, for example, and can be suitable for use in the practice of the present invention so long as the optical and physical properties are suitable for application in the present invention.

The multilayer laminate of the present invention has a total thickness 40.0 mil or less. Preferably, the laminate can have a total thickness of 20.0 or less. More preferably, the laminate can have a total thickness of 10.0 mil or less, and even more preferably a thickness of 4.0 mil or less. Even more preferably, the laminate can have a total thickness of about 3.0 mil or less, or 2.0 mil or less. The thickness required of an encapsulant layer can be a balance between obtaining structural properties required to protect the fragile voltage-generating layer from physical damage, and achieving other goals such as meeting optical and/or electrical requirements for the module, using cost-effective materials, and minimizing production costs.

The optical layers of the present invention are preferably thinner than the structural layers of the present invention, in order that the modulus of the structural layer is determinate of the modulus of the laminate structure. The thickness of the optical layer(s) can each independently be about 50% or less of the thickness of the structural layer. The optical layers of a laminate of the present invention can each independently have a thickness of 20.0 mil or less, preferably 15 mil or less, and more preferably 10 mil or less, with the proviso that any film thickness can be varied to balance the desirable optical and electrical properties, with the practical aspects of producing a cost-effective solar cell module.

In a manufacturing process for solar cell modules, the various components of the module, such as, for example, the encapsulant layers, the voltage-generating layer, and the backing are laid up in a vacuum lamination press and laminated together under vacuum with heat and pressure.

A multilayer laminate film of the present invention can be useful in a variety of applications. The multilayer film of the present invention is a film that exhibits-excellent adhesion to glass, as well as other materials such as for example plastic or other transparent materials, and thus can be suitable for use in combination with glass, or clear plastic, to make optically clear or transparent laminate articles such as solar cell modules, or laminated windows, or other safety glass.

EXAMPLES

The Examples and Comparative Examples are presented for illustrative purposes only, and are not intended to limit the scope of the present invention in any manner.

Comparative Example 1

A 2 mil monolayer blown film was obtained from an ethylene/methacrylic acid (15 wt %) copolymer resin having 1.19 wt % ZnO, and an MI of 5.5 (Resin 1) using a Brampton 3-layer co-extrusion line. The haze of the film was determined according to ASTM D1003-00. The transmission (% T) was determined using a Varian Cary 5 uv/vis/nir system. The film was scanned from 800 nm to 200 nm, and % T reported at 500 nm. The secant modulus was determined according to ASTM D882-01. Controls were run to calibrate each of the analytical methods. The results are given in Table 1.

Comparative Example 2

The procedure of Comparative Example 1 was repeated except that the 2 mil film was obtained from an ethylene/methacrylic acid (10 wt %) copolymer resin having 0.75 wt % ZnO, and an MI of 4.0 (Resin 2). Haze, secant modulus, and % T are reported in Table 1.

Example 1

A 2.0 mil three-layer blown film was obtained by coextruding two 0.5 mil film layers (layers 1 and 3) from Resin 1 and one 1.0 mil film layer (layer 2) from Resin 2, to form the three-layer film. Haze, secant modulus, and % T are reported in Table 1.

Comparative Example 3

Resin 1 (11.5 mil) was extruded using a Sano multi-layer extrusion line. Haze, secant modulus, and % T are reported in Table 1.

Comparative Example 4

Resin 2 (11.5 mil) was extruded using a Sano multi-layer extrusion line. Haze, secant modulus, and % T are reported in Table 1.

Example 2

A three-layer cast film (11.5 mil total) having the structure [Resin 1 (0.6 mil)/Resin 2 (10.3 mil)/Resin 1 (0.6 mil)] was coextruded using a Sano multi-layer extrusion line. Haze, secant modulus, and % T are reported in Table 1.

Example 3

A three-layer cast film (11.5 mil total) having the structure [Resin 1 (1.7 mil)/Resin 2 (8.1 mil)/Resin 1 (1.7 mil)] was coextruded using a Sano multi-layer extrusion line. Haze, secant modulus, and % T are reported in Table 1.

TABLE 1

| Example | Modulus (psi) (MD/TD)[1] | % Haze | Transmission (%) |
|---|---|---|---|
| C1 | 20,694/18,526 | 2.45 | 90.6 |
| C2 | 8,138/7,045 | 6.53 | 84.8 |
| 1 | 10,787/11,789 | 2.37 | 90.4 |
| C3 | 22,429/20,525 | 4.63 | 87.8 |
| C4 | 9,199/8,259 | 12.50 | 83.7 |
| 2 | 10,213/10,062 | 3.57 | 88.5 |
| 3 | 12,479/12,476 | 3.58 | 86.9 |

[1]MD = machine direction,
TD = transverse direction

What is claimed is:

1. A photovoltaic (solar) cell module that comprises at least one encapsulant layer from an optically transparent multi-layer laminate film, wherein the optically transparent multi-layer laminate film is made from three layers of ionomer copolymer film consisting essentially of ionomer copolymer obtained by the copolymerization of ethylene and ethylenically unsaturated $C_3$-$C_8$ carboxylic acid and having about 10 to 100 wt % of the acid groups neutralized, wherein:
 (a) two of the three layers of film are optical layers that each independently transmit at least about 85% of light incident to their respective surfaces, and/or have haze of less than about 6% as measured according to ASTM D1003-00,
 (b) one of the three layers of film is a structural layer which is chemically distinct from the optical layers in that one or more item is varied from the group consisting of: (i) percentage of the acid component in the ionomers, level of neutralization of the acid components in the ionomers, identity of the counterion present in the ionomers, and presence or absence of a third comonomer in the ionomers,
 (c) the optical layers are in contact with opposite surfaces of the structural layer,
 (d) wherein the structural layer has a modulus of less than about 15,000 psi as measured according to ASTM D882-01,
 (e) the multilayer laminate film has a modulus of less than about 15,000 psi as measured according to ASTM D882-01, and
 (f) the multilayer laminate film (i) transmits at least about 85% of incident visible light and/or (ii) has a haze value of equal to or less than about 6% as measured according to ASTM D1003-00.

2. The photovoltaic (solar) cell module of claim 1 wherein each of the optical layers transmits at least about 85% incident light and has a haze of less than about 5%.

3. The photovoltaic (solar) cell module of claim 2 wherein at least one of the optical layers has a haze of less than about 4%.

4. The photovoltaic (solar) cell module of claim 3 wherein each of the optical layers has a haze of less than about 4%.

5. The photovoltaic (solar) cell module of claim 4 wherein at least one of the optical layers has a haze of less than about 3%.

6. The photovoltaic (solar) cell module of claim 1 wherein the laminate structure has a total thickness of about 40.0 mil or less.

7. The photovoltaic (solar) cell module of claim 6 wherein the laminate has a total thickness of about 20.0 mil or less.

8. The photovoltaic (solar) cell module of claim 7 wherein the laminate has a total thickness of about 10.0 mil or less.

9. The photovoltaic (solar) cell module of claim 8 wherein the laminate has a total thickness of about 4.0 mil or less.

10. The photovoltaic (solar) cell module of claim 9 wherein the films used in the optical layers each have a thickness of about 50% or less than the thickness of the structural layer.

11. The photovoltaic (solar) cell module of claim 8 wherein the laminate has a total thickness of about 3.0 mil or less.

12. The photovoltaic (solar) cell module of claim 8 wherein the laminate has a total thickness of about 2.0 mil or less.

13. The photovoltaic (solar) cell module of claim 6 wherein the at least two optical layers each independently has a thickness of 10 mil or less.

14. The photovoltaic (solar) cell module of claim 6 wherein the films used in the optical layers each have a thickness of about 50% or less than the thickness of the structural layer.

15. The solar module of claim 1 wherein the at least one encapsulant layer transmits at least about 88% of the incident light.

16. The photovoltaic (solar) cell module of claim 1 wherein the unsaturated carboxylic acid is selected from acrylic acid and methacrylic acid.

17. The photovoltaic (solar) cell module of claim 16 wherein the ionomer copolymer contains from about 8 weight % to about 20 weight % of units from the unsaturated carboxylic acid.

18. The photovoltaic (solar) cell module of claim 1 further comprising an incident layer and backing.

19. A photovoltaic (solar) cell module that comprises an encapsulant from an optically transparent multilayer laminate film made from three layers of ionomer copolymer film consisting essentially of ionomer copolymers obtained by the copolymerization of ethylene and ethylenically unsaturated $C_3$-$C_8$ carboxylic acid and having about 10 to 100 wt % of the acid groups neutralized, wherein (a) at least two of the three ionomer copolymers are chemically distinct from each other in that one or more item is varied from the group consisting of: (i) percentage of the acid component in the ionomers, level of neutralization of the acid components in the ionomers, identity of the counterion present in the ionomers, and presence or absence of a third comonomer in the ionomers, (b) the multilayer laminate film has a modulus of less than about 15,000 psi as measured according to ASTM D882-01 and (c) the multilayer laminate film (i) transmits at least about 85% of incident visible light and/or (ii) has a haze value of equal to or less than about 6% as measured according to ASTM D1003-00, wherein two of the layers of the laminate film are optical layers that form the outermost layers of the laminate film, and each independently transmit at least about 85% of light incident to their respective surfaces and/or have haze of less than about 6% as measured according to ASTM D1003-00, and the other layer of film is a structural layer positioned between the optical layers, and wherein the thickness of the optical layer(s) are each independently about 50% or less of the thickness of the structural layer.

20. The photovoltaic (solar) cell module of claim 19 wherein the structural layer (a) has a modulus of less than about 15,000 psi as measured according to ASTM D882-01.

21. The photovoltaic (solar) cell module of claim 19 wherein the unsaturated carboxylic acid is selected from acrylic acid and methacrylic acid.

22. A photovoltaic (solar) cell module that comprises an encapsulant from an optically transparent multilayer laminate film made of two optical layers as the outermost layers of the encapsulant laminate film and a structural layer positioned between the optical layers, wherein:

(a) the optical layers, which may be the same or different, each (i) are prepared of an ionomer copolymer film consisting essentially of ionomer copolymer (i) obtained by the copolymerization of ethylene and ethylenically unsaturated $C_3$-$C_8$ carboxylic acid and having about 10 to 100 wt % of the acid groups neutralized, and (ii) which transmits at least about 85% of light incident to their respective surfaces and/or have haze of less than about 6%;
(b) the structural layer is prepared of an ionomer copolymer film (i) consisting essentially of ionomer copolymer obtained by the copolymerization of ethylene and ethylenically unsaturated $C_3$-$C_8$ carboxylic acid and having about 10 to 100 wt % of the acid groups are neutralized, (ii) which has a modulus of less than about 15,000 psi as measured according to ASTM D882-01, and (iii) which has a transparency of greater than about 85% and/or a haze greater than about 6%;
(c) the laminate (i) transmits at least about 85% of incident visible light and/or (ii) has a haze of equal to or less than about 6% as measured according to ASTM D1003-00;
(d) the multilayer laminate film has a modulus of less than about 15,000 psi as measured according to ASTM D882-01; and
(e) the structural layer is chemically distinct from the optical layers in that one or more item is varied from the group consisting of: (i) percentage of the acid component in the ionomers, level of neutralization of the acid components in the ionomers, identity of the counterion present in the ionomers, and presence or absence of a third comonomer in the ionomers.

23. The photovoltaic (solar) cell module of claim 22 wherein:
(a) the laminate has a total thickness of 40.0 mil or less;
(b) the films used in the optical layers each have a thickness of about 50% or less than the thickness of the structural layer, and each independently transmit at least about 85% of light incident to their respective surfaces and have haze of less than about 5%;
(c) in the optical layers, (i) the ionomer copolymers comprise about 12 to about 20 weight % of units from the carboxylic acid and (ii) the unsaturated carboxylic acids are selected from acrylic acid and methacrylic acid;
(d) in the structural layer (i) the ionomer copolymer comprises about 8 to about 12 weight % of units from the carboxylic acid and (ii) the unsaturated carboxylic acid is selected from acrylic acid and methacrylic acid; and
(e) the laminate (i) transmits at least about 85% of incident visible light and (ii) has a haze of equal to or less than about 5% as measured according to ASTM D1003-00.

24. The photovoltaic (solar) cell module of claim 23 wherein the film for the structural layer has a transparency of greater than about 85% and/or a haze greater than about 6%.

25. The photovoltaic (solar) cell module of claim 24 wherein the structural layer (a) has a modulus of less than about 13,000 psi as measured according to ASTM D882-01.

26. The photovoltaic (solar) cell module of claim 25 wherein the laminate has a total thickness of about 10.0 mil or less.

27. The photovoltaic (solar) cell module of claim 23 wherein the laminate has a total thickness of about 20.0 mil or less.

28. The photovoltaic (solar) cell module of claim 23 wherein the laminate has a total thickness of about 4.0 mil or less.

29. The photovoltaic (solar) cell module of claim 22 wherein the unsaturated carboxylic acid is selected from acrylic acid and methacrylic acid.

30. A process of preparing a photovoltaic cell module comprising providing a voltage-generating layer and encapsulating the voltage-generating layer with an optically transparent multilayer encapsulant laminate made of two optical layers as the outermost layers of the laminate and a structural layer positioned between the optical layers, wherein the laminate (i) transmits at least about 85% of incident visible light and/or (ii) has a haze of equal to or less than about 6% as measured according to ASTM D1003-00, wherein:
(a) the optical layers, which may be the same or different, each are prepared from an ionomer copolymer film consisting essentially of ionomer copolymer obtained by the copolymerization of ethylene and ethylenically unsaturated $C_3$-$C_8$ carboxylic acid and having about 10 to 100 wt % of the acid groups neutralized, which transmits at least about 85% of light incident to its respective surfaces and/or has a haze of less than about 6% as measured according to ASTM D1003-00;
(b) the structural layer is prepared from an ionomer copolymer film (i) consisting essentially of ionomer copolymer obtained by the copolymerization of ethylene and ethylenically unsaturated $C_3$-$C_8$ carboxylic acid and having about 10 to 100 wt % of the acid groups are neutralized, which has a modulus of less than about 15,000 psi as measured according to ASTM D882-01, and (ii) which has a transparency of greater than about 85% and/or a haze greater than about 6%;
(c) the structural layer is chemically distinct from the optical layers in that one or more item is varied from the group consisting of: (i) percentage of the acid component in the ionomers, level of neutralization of the acid components in the ionomers, identity of the counterion present in the ionomers, and presence or absence of a third comonomer in the ionomers; and
wherein the laminate has a modulus of less than about 15,000 psi as measured according to ASTM D882-01.

31. The process of claim 30 wherein:
(a) the laminate has a total thickness of 40.0 mil or less;
(b) the films used in the optical layers each have a thickness of about 50% or less than the thickness of the structural layer, and each independently transmit at least about 85% of light incident to their respective surfaces and have haze of less than about 5%;
(c) in the optical layers, (i) the ionomer copolymers comprise about 12 to about 20 weight % of units from the carboxylic acid and (ii) the unsaturated carboxylic acids are selected from acrylic acid and methacrylic acid;
(d) in the structural layer (i) the ionomer copolymer comprises about 8 to about 12 weight % of units from the carboxylic acid and (ii) the unsaturated carboxylic acid is selected from acrylic acid and methacrylic acid; and
(e) the laminate (i) transmits at least about 85% of incident visible light and (ii) has a haze of equal to or less than about 5% as measured according to ASTM D1003-00.

32. The process of claim 31 wherein the film for the structural layer has a transparency of greater than about 85% and/or a haze greater than about 6%.

33. The photovoltaic (solar) cell module of claim 30 wherein the unsaturated carboxylic acid is selected from acrylic acid and methacrylic acid.

\* \* \* \* \*